(12) United States Patent
Kawahara et al.

(10) Patent No.: US 11,257,829 B2
(45) Date of Patent: Feb. 22, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Shinji Kawahara, Yokohama Kanagawa (JP); Takeshi Yamamoto, Kawasaki Kanagawa (JP); Kazuaki Yamaura, Yokohama Kanagawa (JP); Nobuyuki Toda, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 38 days.

(21) Appl. No.: 16/816,816

(22) Filed: Mar. 12, 2020

(65) Prior Publication Data

US 2021/0082929 A1    Mar. 18, 2021

(30) Foreign Application Priority Data

Sep. 17, 2019    (JP) .............................. JP2019-168419

(51) Int. Cl.
| | | |
|---|---|---|
| H01L 27/11517 | (2017.01) | |
| H01L 27/07 | (2006.01) | |
| H01L 29/423 | (2006.01) | |
| H01L 27/108 | (2006.01) | |
| G11C 16/04 | (2006.01) | |

(52) U.S. Cl.
CPC .... *H01L 27/11517* (2013.01); *G11C 16/0441* (2013.01); *H01L 27/0733* (2013.01); *H01L 27/10805* (2013.01); *H01L 27/10855* (2013.01); *H01L 29/42328* (2013.01)

(58) Field of Classification Search
CPC ............. H01L 23/5223; H01L 27/0733; H01L 27/10805; H01L 27/10855; H01L 27/10808; H01L 27/11517; H01L 28/40; H01L 29/42328; G11C 16/0441
See application file for complete search history.

(56) References Cited

U.S. PATENT DOCUMENTS

| | | | |
|---|---|---|---|
| 7,492,002 B2 | 2/2009 | Jeon et al. | |
| 8,107,290 B2 | 1/2012 | Lee et al. | |
| 8,169,828 B2 | 5/2012 | Jung | |
| 2004/0051130 A1 | 3/2004 | Miyajima | |
| 2009/0078990 A1* | 3/2009 | Yasuda | H01L 29/4234 257/326 |

(Continued)

FOREIGN PATENT DOCUMENTS

| | | |
|---|---|---|
| JP | H11-214548 A | 8/1999 |
| JP | 2004-111624 A | 4/2004 |
| JP | 2006-191049 A | 7/2006 |

(Continued)

*Primary Examiner* — Eduardo A Rodela
(74) *Attorney, Agent, or Firm* — Allen & Overy LLP

(57) ABSTRACT

A semiconductor device includes: a semiconductor substrate; a first transistor provided at an upper surface of the semiconductor substrate; and a first capacitor provided above the first transistor and connected to a gate of the first transistor. A tunnel current is able to flow between the gate and the semiconductor substrate.

7 Claims, 15 Drawing Sheets

(56) References Cited

U.S. PATENT DOCUMENTS

2011/0260158 A1* 10/2011 Takemura ............ H01L 27/105
                                                          257/43
2012/0063233 A1* 3/2012 Lee ................... H01L 27/11521
                                                       365/185.22

FOREIGN PATENT DOCUMENTS

JP    2009-267395 A    11/2009
JP    2010-157733 A    7/2010

* cited by examiner

|  |  | OPERATION | | |
|---|---|---|---|---|
|  |  | PROGRAM | READ | ERASE |
| INTER-CONNECT | GATE LINE CG | HV | Vread | GND |
| | ERASE GATE LINE EG | GND | GND | HV |
| | BIT LINE BL | FLOATING | VBL | FLOATING |
| | SOURCE LINE SL | FLOATING | GND | FLOATING |

FIG. 15

SEMICONDUCTOR DEVICE

CROSS-REFERENCE TO RELATED APPLICATIONS

This application is based upon and claims the benefit of priority from Japanese Patent Application No. 2019-168419, filed on Sep. 17, 2019; the entire contents of which are incorporated herein by reference.

FIELD

Embodiments relate to a semiconductor device.

BACKGROUND

Conventionally, a semiconductor device has been manufactured in which a logic circuit and a memory element are provided together. Even in such a semiconductor device, it is desirable to downsize the memory element.

BRIEF DESCRIPTION OF THE DRAWINGS

FIG. 15 is a table showing potential applied to interconnects in operations of the semiconductor device according to the embodiment.

DETAILED DESCRIPTION

In general, according to one embodiment, a semiconductor device includes: a semiconductor substrate; a first transistor provided at an upper surface of the semiconductor substrate; and a first capacitor provided above the first transistor and connected to a gate of the first transistor. A tunnel current is able to flow between the gate and the semiconductor substrate.

Embodiments of the invention will now be described.

Figure 1:
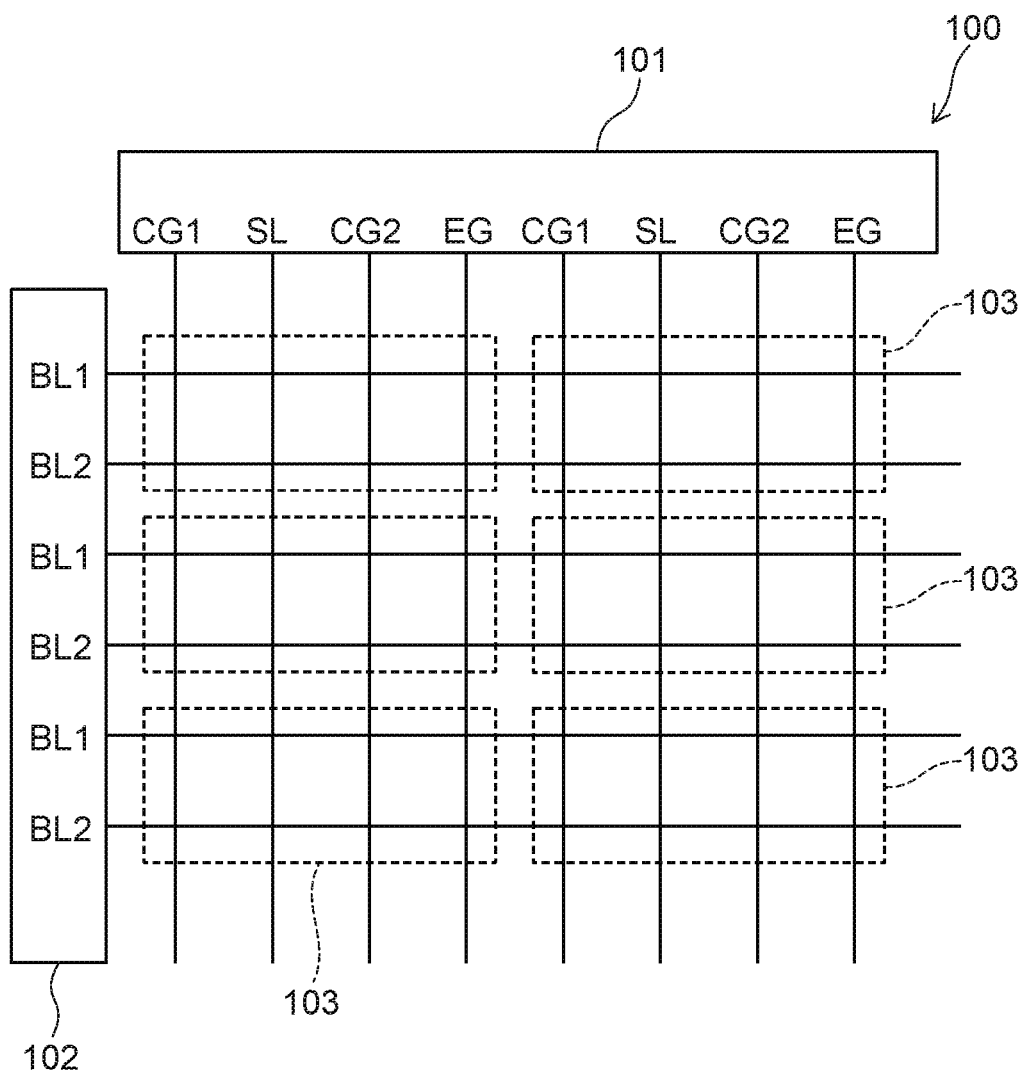
FIG. 1 is a circuit diagram showing a semiconductor device according to an embodiment.

FIG. 1 is a circuit diagram showing a semiconductor device according to the embodiment.

Figure 2:
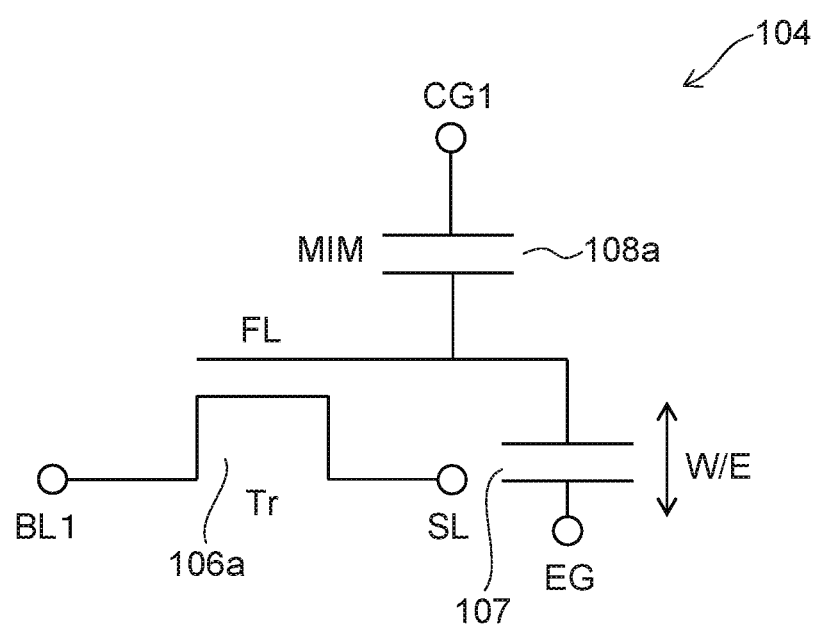
FIG. 2 is a circuit diagram showing a memory element of the semiconductor device according to the embodiment.
Figure 3:
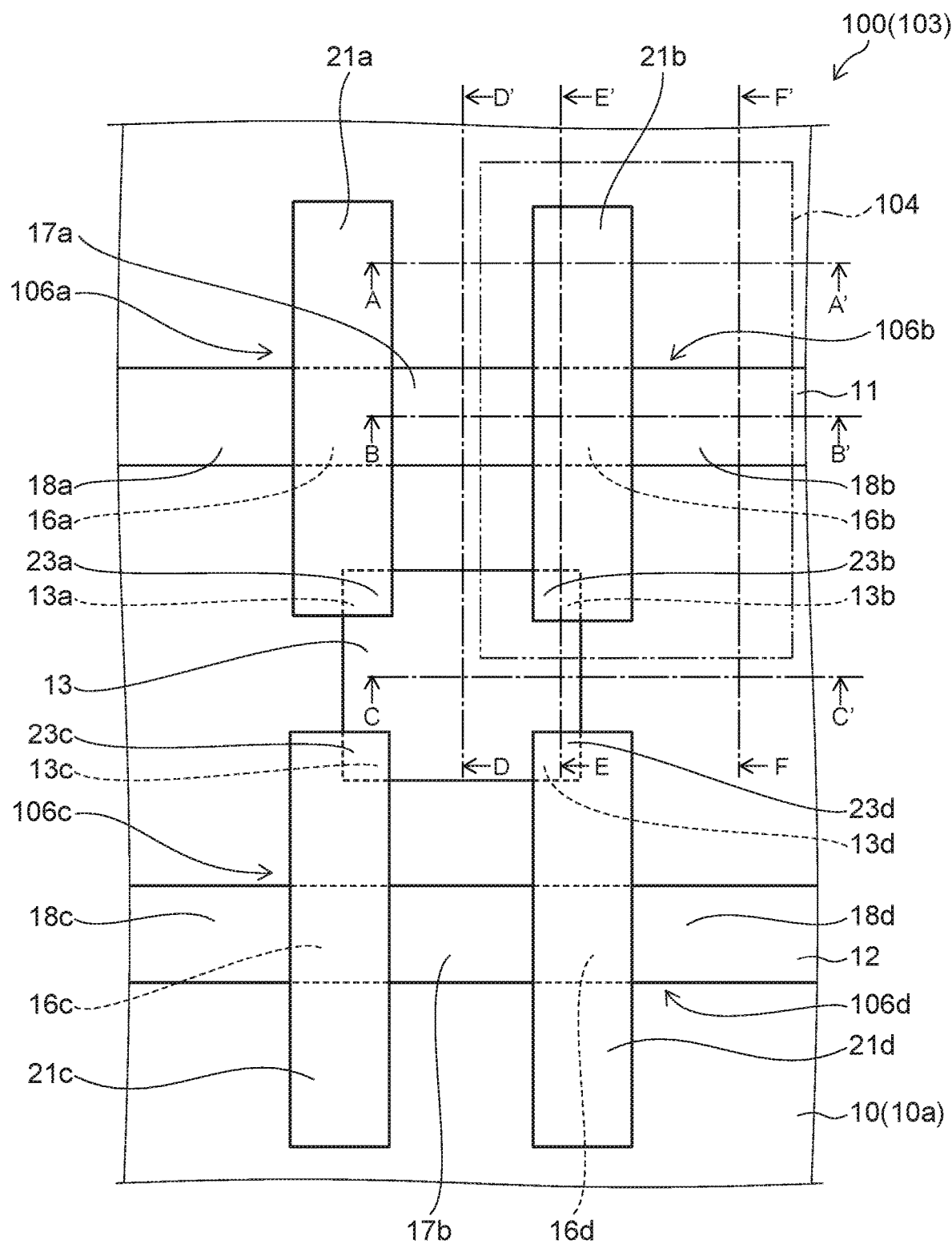
FIG. 3 is a plan view showing the semiconductor device according to the embodiment.
Figure 4:
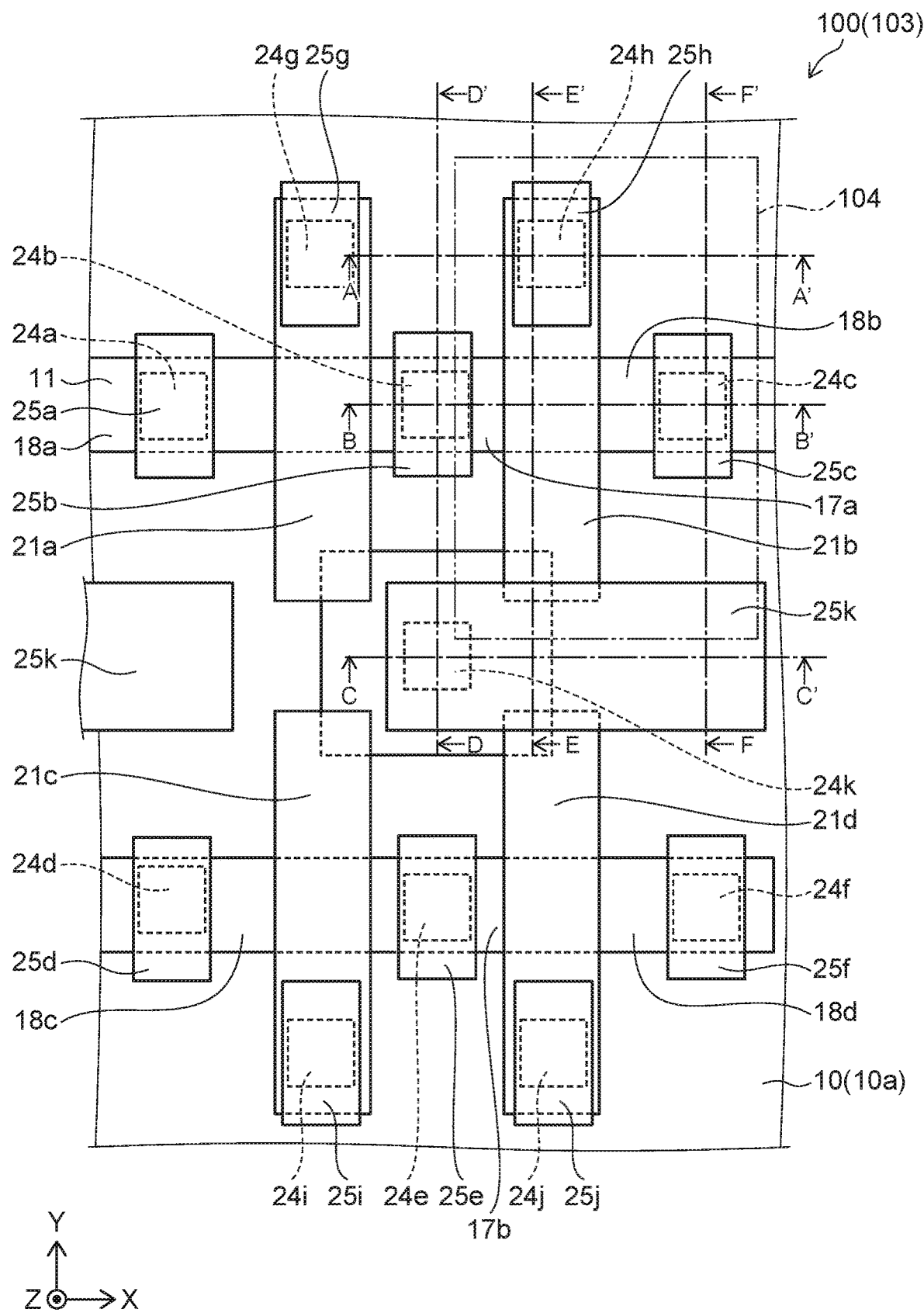
FIG. 4 is a plan view showing the semiconductor device according to the embodiment.
Figure 5:
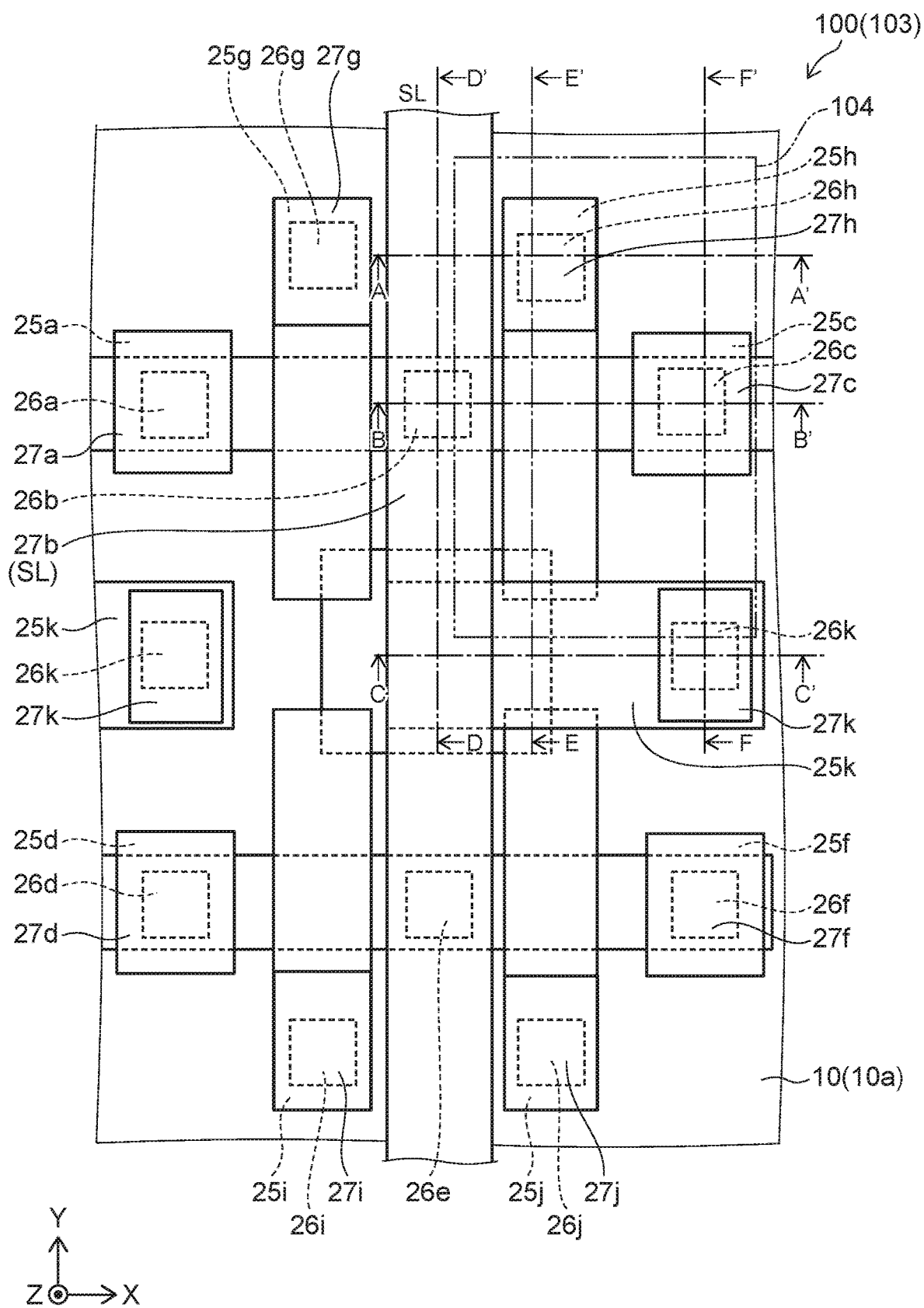
FIG. 5 is a plan view showing the semiconductor device according to the embodiment.
Figure 6:
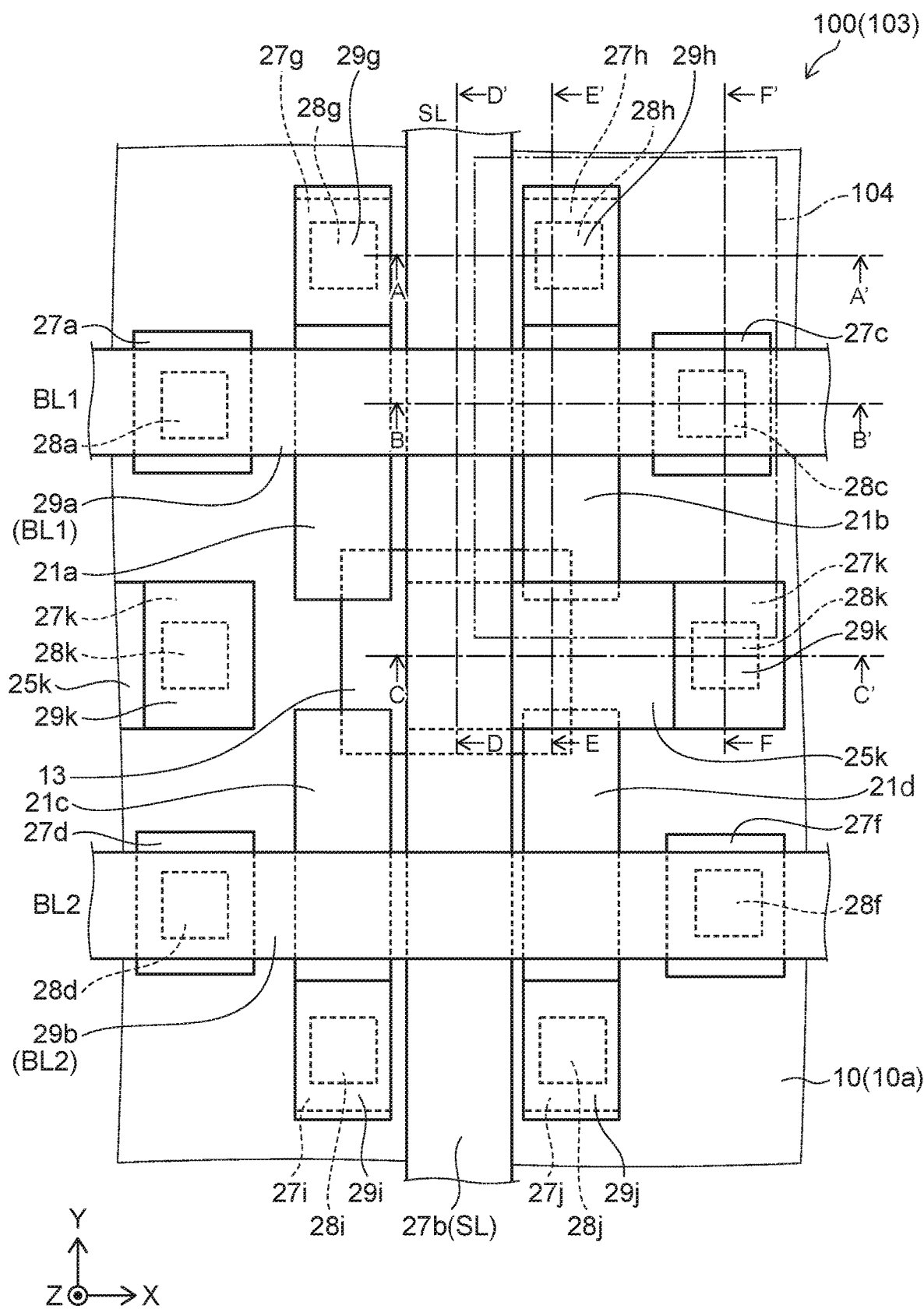
FIG. 6 is a plan view showing the semiconductor device according to the embodiment.
Figure 7:
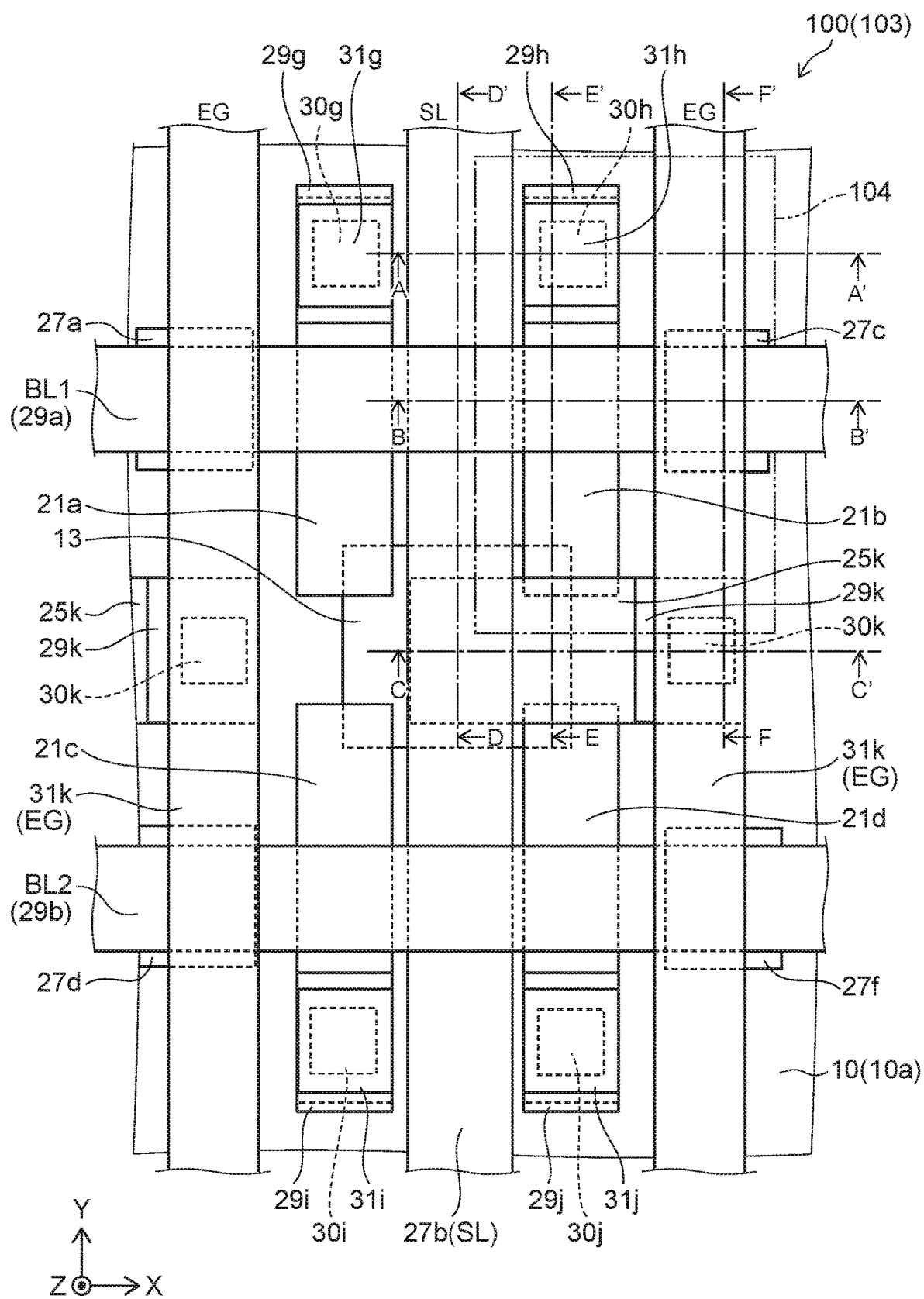
FIG. 7 is a plan view showing the semiconductor device according to the embodiment.
Figure 8:
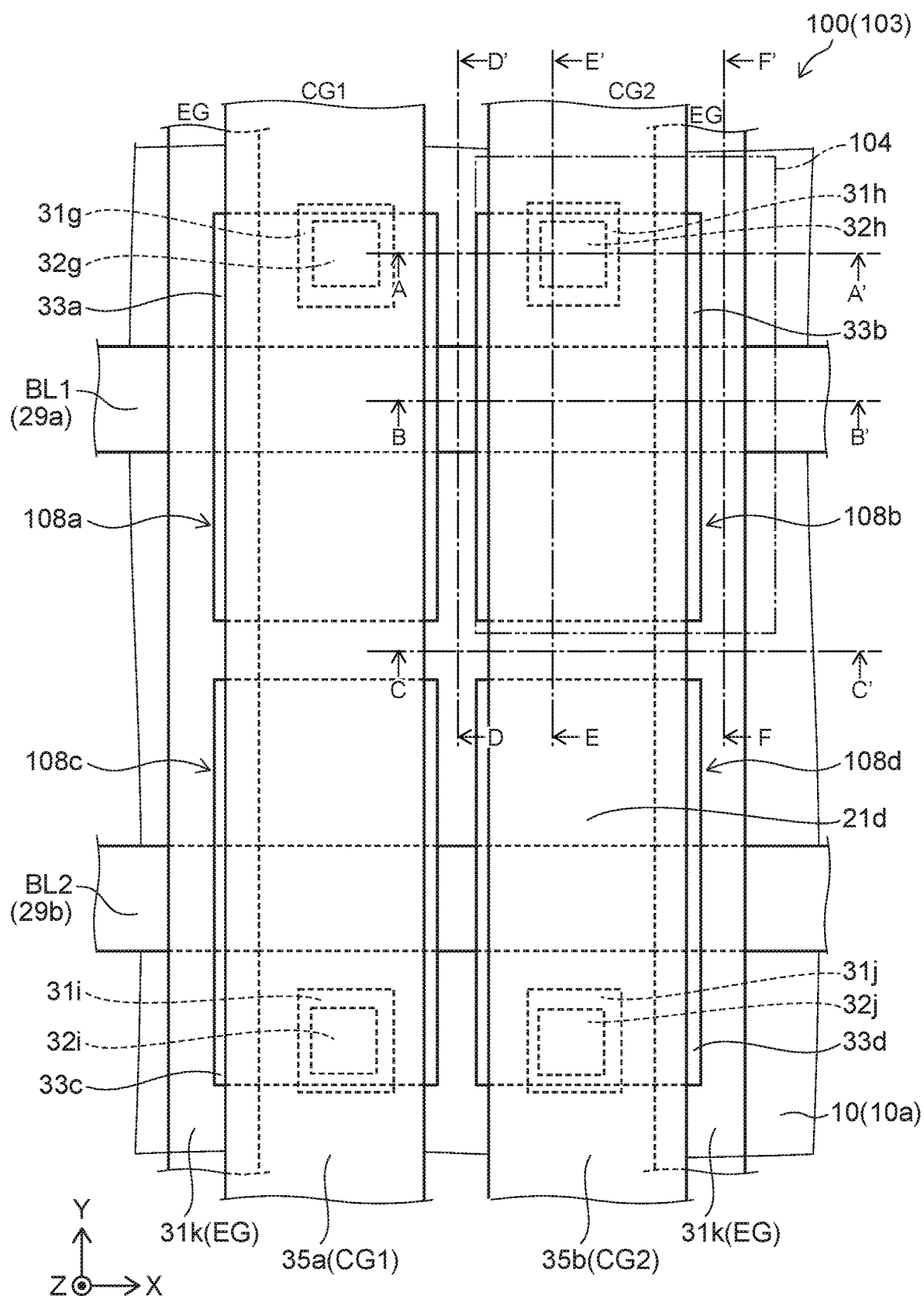
FIG. 8 is a plan view showing the semiconductor device according to the embodiment.

FIG. 2 is a circuit diagram showing a memory element of the semiconductor device according to the embodiment.

FIG. 3 to FIG. 8 are plan views showing the semiconductor device according to the embodiment. FIG. 3 to FIG. 8 show slightly different planes from the lower layer toward the upper layer.

Figure 9:
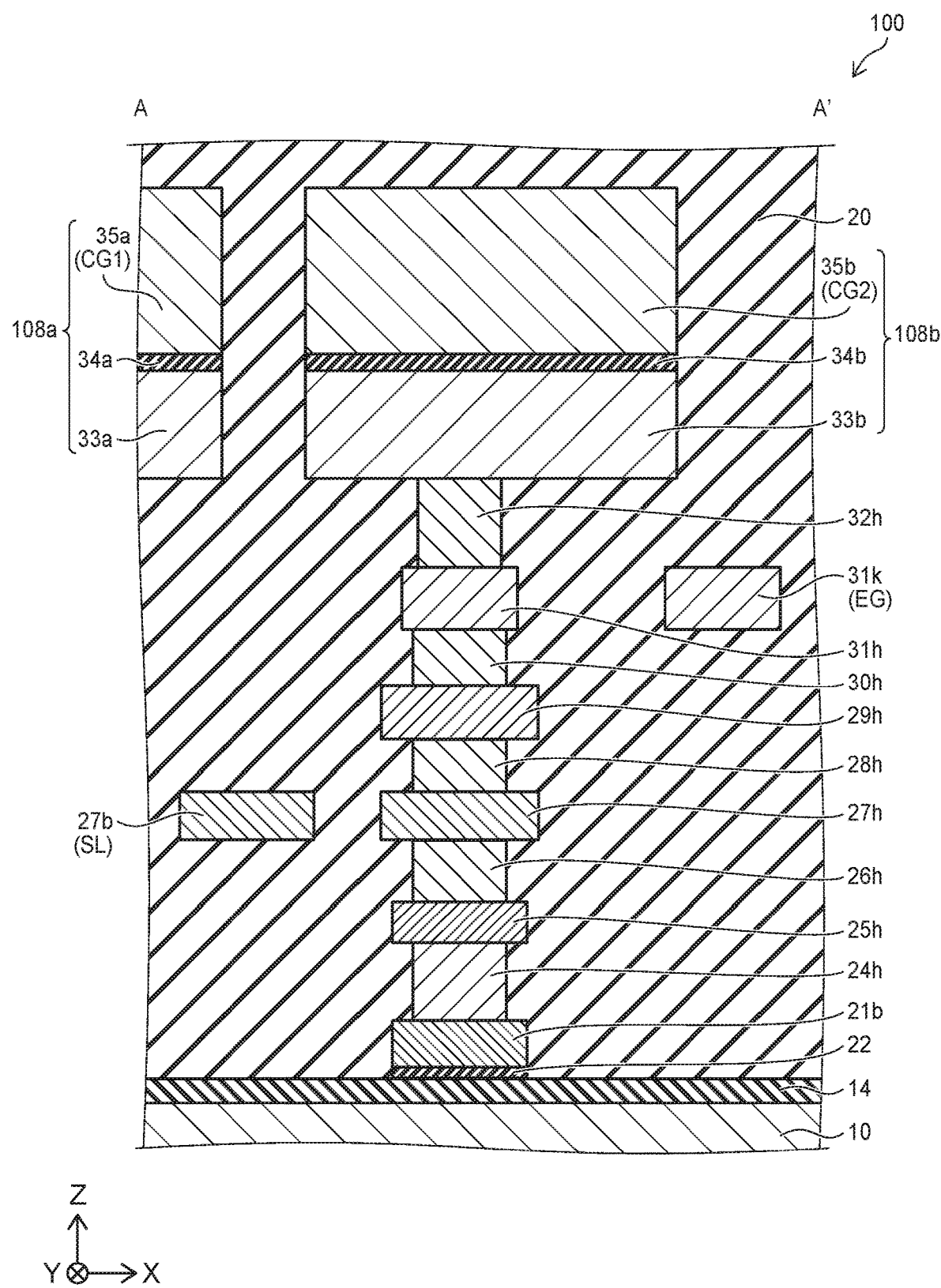
FIG. 9 is a cross-sectional view along line A-A' shown in FIG. 3 to FIG. 8.

FIG. 9 is a cross-sectional view along line A-A' shown in FIG. 3 to FIG. 8.

Figure 10:
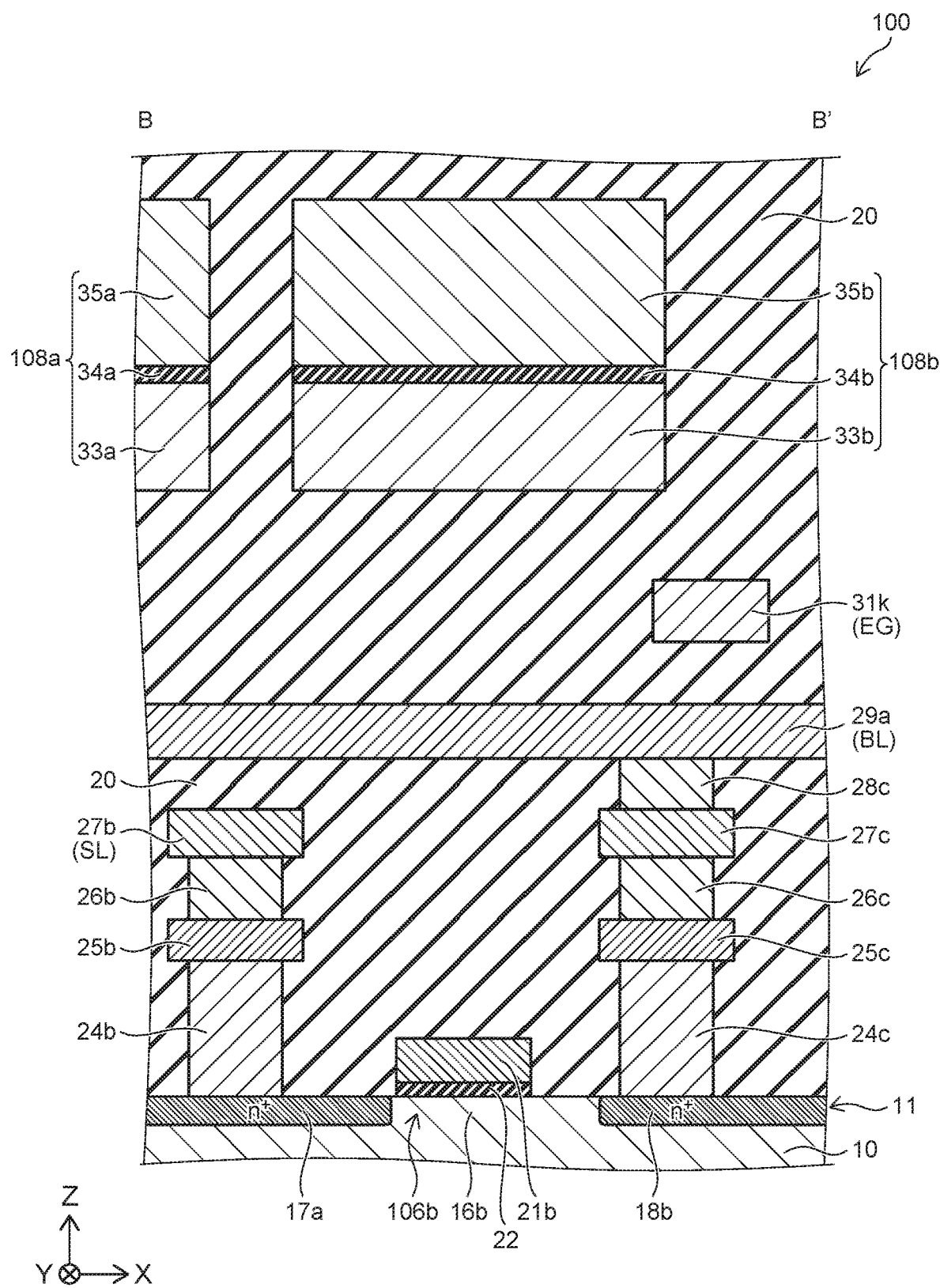
FIG. 10 is a cross-sectional view along line B-B' shown in FIG. 3 to FIG. 8.

FIG. 10 is a cross-sectional view along line B-B' shown in FIG. 3 to FIG. 8.

Figure 11:
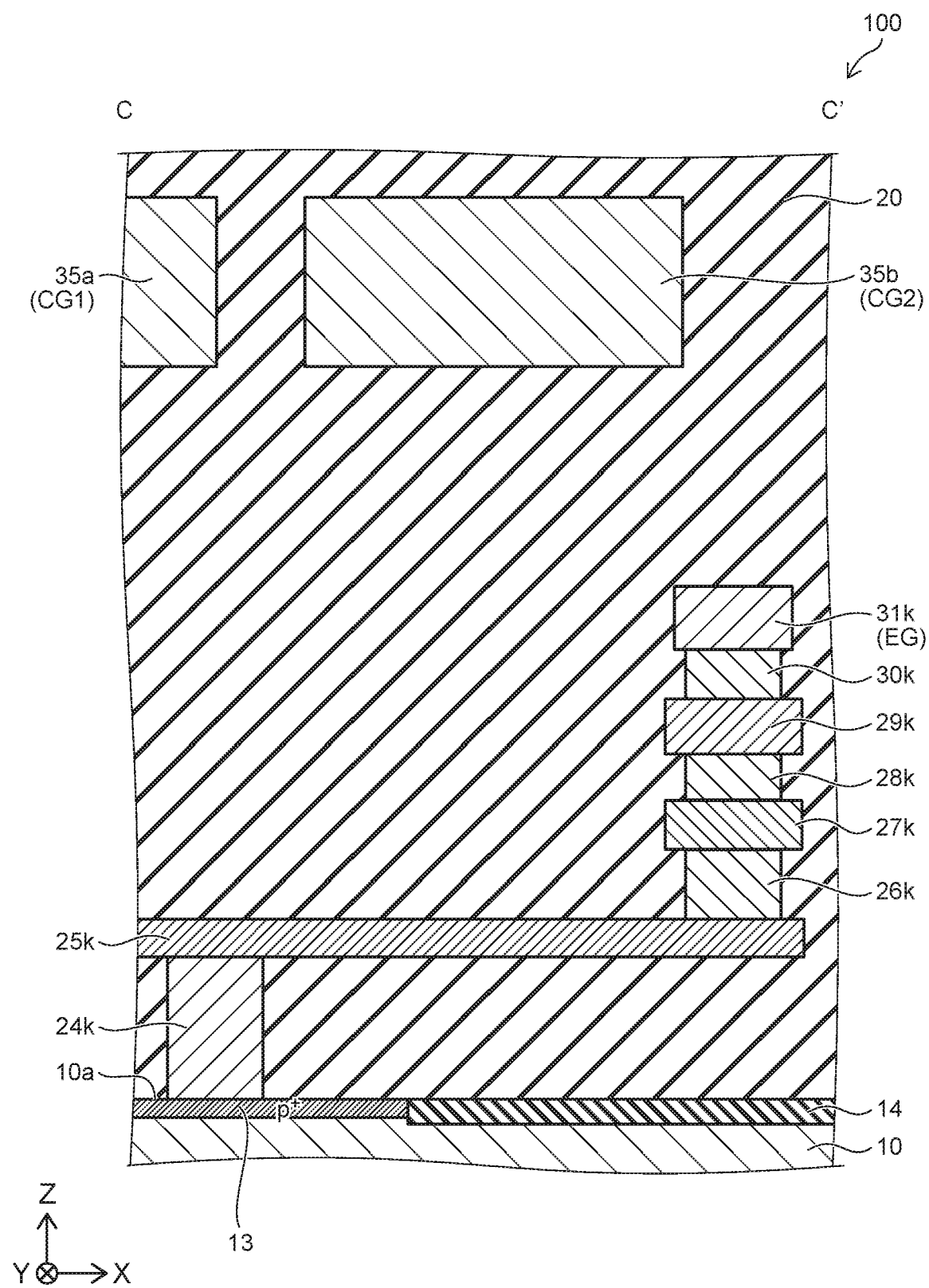
FIG. 11 is a cross-sectional view along line C-C' shown in FIG. 3 to FIG. 8.

FIG. 11 is a cross-sectional view along line C-C' shown in FIG. 3 to FIG. 8.

Figure 12:
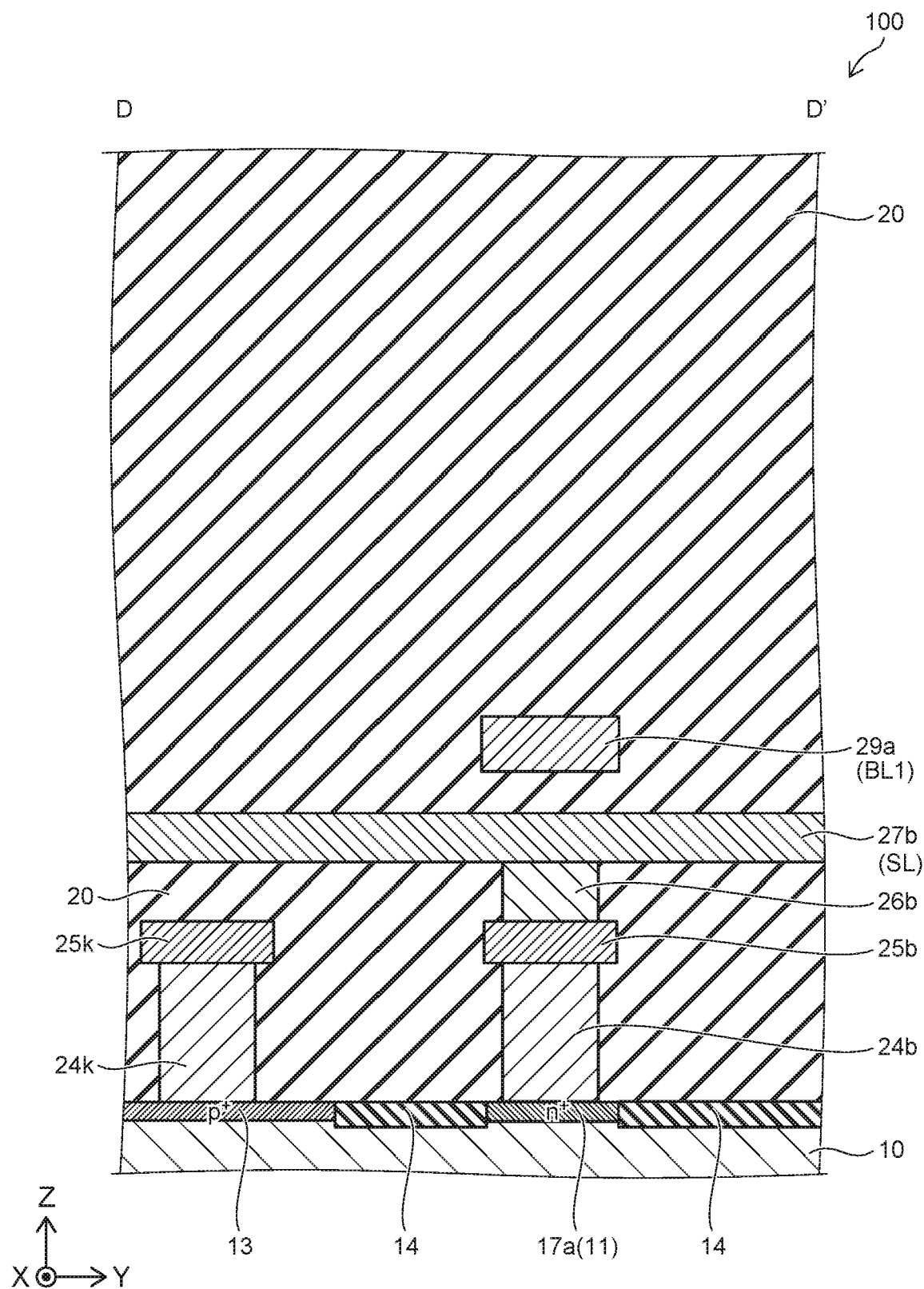
FIG. 12 is a cross-sectional view along line D-D' shown in FIG. 3 to FIG. 8.

FIG. 12 is a cross-sectional view along line D-D' shown in FIG. 3 to FIG. 8.

Figure 13:
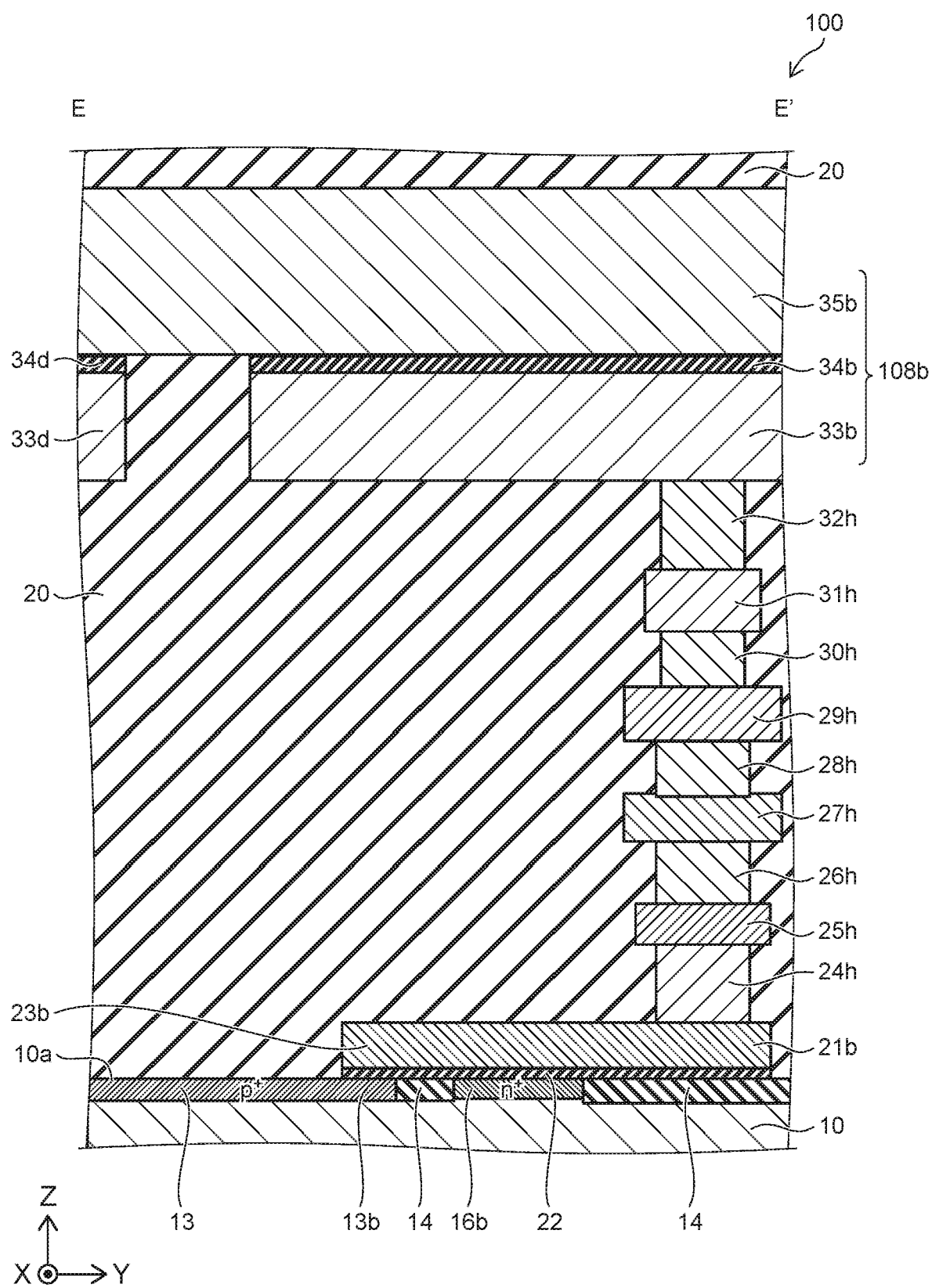
FIG. 13 is a cross-sectional view along line E-E' shown in FIG. 3 to FIG. 8.

FIG. 13 is a cross-sectional view along line E-E' shown in FIG. 3 to FIG. 8.

Figure 14:
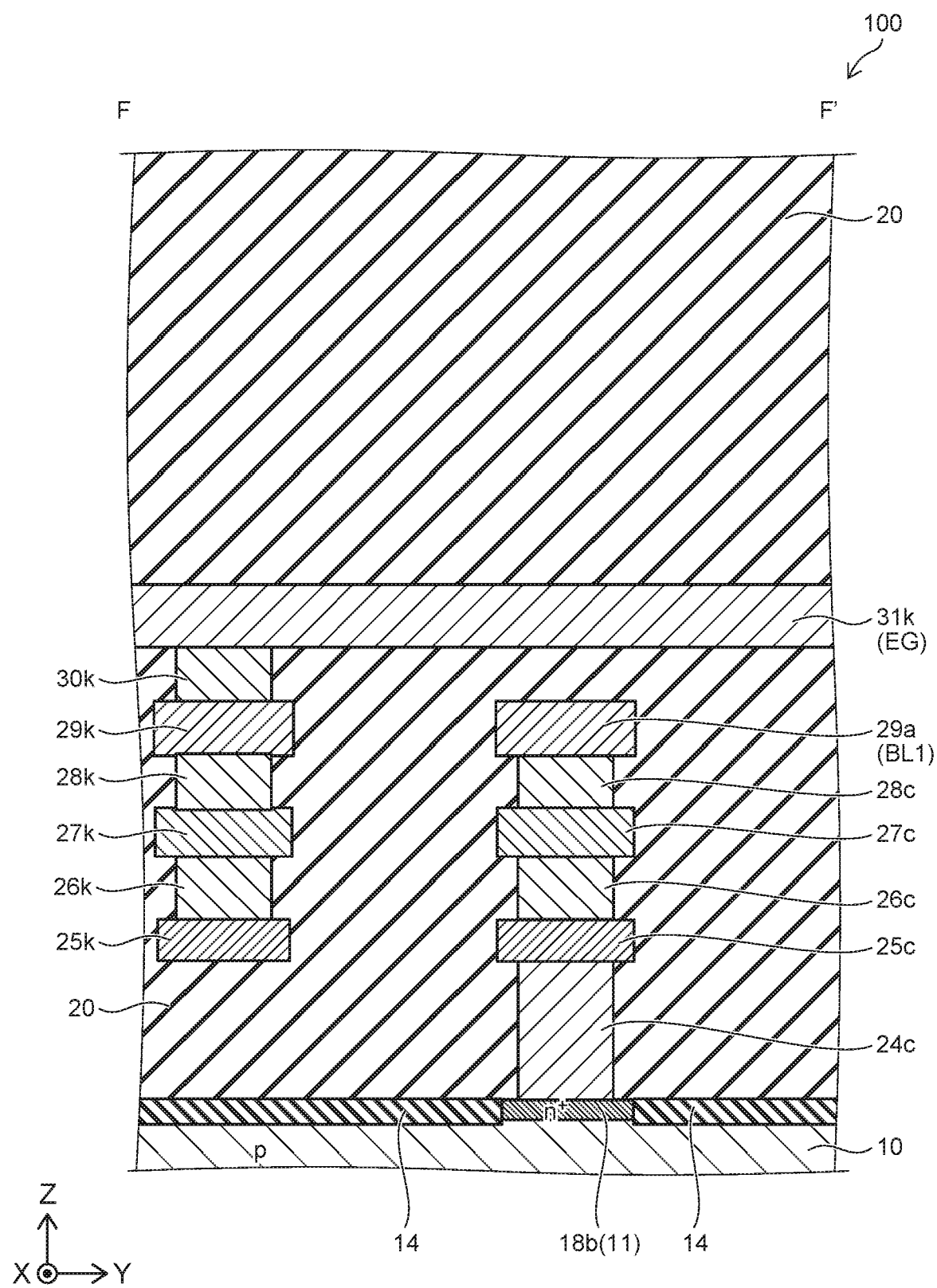
FIG. 14 is a cross-sectional view along line F-F' shown in FIG. 3 to FIG. 8.

FIG. 14 is a cross-sectional view along line F-F' shown in FIG. 3 to FIG. 8.

The drawings are schematic and have appropriate exaggerations and omissions. The positional relationships and the vertical:horizontal ratios of the components do not match strictly between the drawings.

As shown in FIG. 1, decoders 101 and 102 are provided in the semiconductor device 100 according to the embodiment. A first gate line CG1, a source line SL, a second gate line CG2, and an erase gate line EG each have multiple lines drawn out from the decoder 101. A first bit line BL1 and a second bit line BL2 each have multiple lines drawn out from the decoder 102. A memory unit 103 is formed at a portion where the first bit line BL1 and the second bit line BL2 cross with the first gate line CG1, the source line SL, the second gate line CG2, and the erase gate line EG. As described below, four memory elements 104 are provided in each memory unit 103.

As shown in FIG. 2, a transistor 106a is provided between the first bit line BL1 and the source line SL in one of the memory elements 104 provided in the memory unit 103. A floating gate electrode FL is provided in the transistor 106a. A capacitor 107 is provided between the floating gate electrode FL and the erase gate line EG. The floating gate electrode FL and the erase gate line EG have a tunnel junction via the capacitor 107. A MIM (Metal-Insulator-Metal) capacitor 108a is provided between the floating gate electrode FL and the first gate line CG1. The floating gate electrode FL and the first gate line CG1 are capacitively coupled via the MIM capacitor 108a.

The memory element 104 may be connected to the second bit line BL2 instead of the first bit line BL1, and may be connected to the second gate line CG2 instead of the first gate line CG1. The memory element 104 is provided at each crossing point between the bit lines and the gate lines. A first memory element 104 which is connected to the first bit line BL1 and the first gate line CG1 (referring to FIG. 2), a second memory element 104 which is connected to the first bit line BL1 and the second gate line CG2, a third memory element 104 which is connected to the second bit line BL2 and the first gate line CG1, and a fourth memory element 104 which is connected to the second bit line BL2 and the second gate line CG2, i.e., a total of four memory elements 104, are provided in the memory unit 103.

As shown in FIG. 3 and FIG. 9 to FIG. 14, a silicon substrate 10 is provided as a semiconductor substrate in the semiconductor device 100. A region that substantially corresponds to one memory unit 103 is shown in FIG. 9 to FIG. 14. However, portions of the adjacent memory units 103 also are shown to illustrate the relationship between the components between the adjacent memory units 103. Although the configuration of one memory unit 103 is described hereinbelow, this is similar for the configurations of the other memory units 103 as well.

Hereinbelow, an XYZ orthogonal coordinate system is employed in the specification for convenience of description. Two mutually-orthogonal directions parallel to an upper surface 10a of the silicon substrate 10 are taken as an "X-direction" and a "Y-direction"; and a direction orthogonal to the upper surface 10a of the silicon substrate 10 is taken as a "Z-direction." In the "Z-direction," a direction away from the silicon substrate 10 when referenced to the upper surface 10a of the silicon substrate 10 also is called "up"; and a direction into the silicon substrate 10 also is called "down"; but these expressions are for convenience and are independent of the direction of gravity. The Z-direction also is called the "vertical direction."

The conductivity type of the upper layer portion of the silicon substrate 10 is, for example, a p-type. A first semiconductor region 11, a second semiconductor region 12, and an EG diffusion region 13 are provided in the upper layer portion of the silicon substrate 10. One of each of the first semiconductor region 11, the second semiconductor region 12, and the EG diffusion region 13 are provided in one memory unit 103.

The first semiconductor region 11 and the second semiconductor region 12 have band configurations extending in the X-direction. The first semiconductor region 11 and the second semiconductor region 12 may be formed for each memory unit 103, or may be formed over multiple memory units 103 arranged in the X-direction. The first semiconductor region 11 and the second semiconductor region 12 are arranged alternately along the Y-direction. The first semiconductor region 11 and the second semiconductor region 12 are active areas.

The EG diffusion region 13 is provided between the first semiconductor region 11 and the second semiconductor region 12 in the Y-direction. When viewed from above, the configuration of the EG diffusion region 13 is, for example, a rectangle. Accordingly, four corner portions 13a, 13b, 13c, and 13d exist in the EG diffusion region 13. The conductivity type of the EG diffusion region 13 is, for example, the $p^+$-type. The impurity concentration of the EG diffusion region 13 is higher than the impurity concentration of the upper layer portion of the silicon substrate 10.

A STI (Shallow Trench Isolation; an element-separation insulating film) 14 is formed at a region of the upper surface 10a of the silicon substrate 10 other than the first semiconductor region 11, the second semiconductor region 12, and the EG diffusion region 13. The first semiconductor region 11, the second semiconductor region 12, and the EG diffusion region 13 are electrically isolated from each other by the STI 14. Two regions being electrically isolated refers to the effects of the operation of one region on the operation of another region being such that practical problems are not caused. The first semiconductor region 11, the second semiconductor region 12, and the EG diffusion region 13 are in an opening of the STI 14.

An inter-layer insulating film 20 is provided on the silicon substrate 10. The components described below are provided inside the inter-layer insulating film 20. The inter-layer insulating film 20 is not illustrated in FIG. 3 to FIG. 8.

Four floating gate electrode layers 21a, 21b, 21c, and 21d (hereinbelow, also generally referred to as the "floating gate electrode layer 21") are provided as the floating gate electrodes FL on the silicon substrate 10, The floating gate electrode layers 21a, 21b, 21c, and 21d are provided in a matrix configuration of two rows and two columns along the X-direction and the Y-direction. When viewed from above, the configuration of each floating gate electrode layer 21 is a rectangle having the longitudinal direction in the Y-direction. The floating gate electrode layers 21a and 21b straddle the first semiconductor region 11; and the floating gate electrode layers 21c and 21d straddle the second semiconductor region 12. The floating gate electrode layer 21 is formed of a conductive material, e.g., polysilicon. A gate insulating layer 22 is provided between the silicon substrate 10 and the floating gate electrode layer 21 and between the STI 14 and the floating gate electrode layer 21. For example, the gate insulating layer 22 is formed of silicon oxide (SiO).

One corner portion of the floating gate electrode layer 21 extends onto one corner portion of the EG diffusion region 13 for each of the floating gate electrode layers 21. In other words, the four corner portions of the EG diffusion region 13 are covered with four of the floating gate electrode layers 21. Therefore, in the vertical direction (the Z-direction), the corner portions of the floating gate electrode layers 21 overlap the corner portions of the EG diffusion region 13. Specifically, a corner portion 23a of the floating gate electrode layer 21a is disposed on the corner portion 13a of the EG diffusion region 13. A corner portion 23b of the floating gate electrode layer 21b is disposed on the corner portion 13b of the EG diffusion region 13. A corner portion 23c of the floating gate electrode layer 21c is disposed on the corner portion 13c of the EG diffusion region 13. A corner portion 23d of the floating gate electrode layer 21d is disposed on the corner portion 13d of the EG diffusion region 13. Thereby, the capacitors 107 are formed between the EG diffusion region 13 and the floating gate electrode layers 21. The floating gate electrode layers 21 have tunnel junctions with the EG diffusion region 13. In other words, tunnel currents can flow via the gate insulating layer 22 between the silicon substrate 10 and the floating gate electrode layers 21. In other words, the tunnel current is able to flow between the EG diffusion region 13 of the silicon substrate 10 and the floating gate electrode layer for each of the floating gate electrode layer 21a, the floating gate electrode layer 21b, the floating gate electrode layer 21c, and the floating gate electrode layer 21d; and these tunnel currents are able to flow via the same opening of the STI 14.

The region of the first semiconductor region 11 directly under the floating gate electrode layer 21a is a channel region 16a. The region of the first semiconductor region 11 directly under the floating gate electrode layer 21b is a channel region 16b. The region of the second semiconductor region 12 directly under the floating gate electrode layer 21c is a channel region 16c. The region of the second semiconductor region 12 directly under the floating gate electrode layer 21d is a channel region 16d. The conductivity types of the channel regions 16a, 16b, 16c, and 16d are the p-type.

The regions of the first semiconductor region 11 sandwiching the channel region 16a are a drain region 18a and a source region 17a. The regions of the first semiconductor region 11 sandwiching the channel region 16b are the source region 17a and a drain region 18b. In other words, in the first semiconductor region 11, the drain region 18a, the channel region 16a, the source region 17a, the channel region 16b, and the drain region 18b are arranged in this order along the Y-direction.

The regions of the second semiconductor region 12 sandwiching the channel region 16c are a drain region 18c and a source region 17b. The regions of the second semiconductor region 12 sandwiching the channel region 16d are the source region 17b and a drain region 18d. In other words, in the second semiconductor region 12, the drain region 18c, the channel region 16c, the source region 17b, the channel region 16d, and the drain region 18d are arranged in this order along the Y-direction. The conductivity types of the source regions 17a and 17b and the drain regions 18a to 18d are, for example, the n⁺-type.

The transistor 106a is formed of the drain region 18a, the channel region 16a, the source region 17a, the gate insulating layer 22, and the floating gate electrode layer 21a in the upper surface 10a of the silicon substrate 10. Similarly, a transistor 106b is formed of the source region 17a, the channel region 16b, the drain region 18b, the gate insulating layer 22, and the floating gate electrode layer 21b in the upper surface 10a of the silicon substrate 10. A transistor 106c is formed of the drain region 18c, the channel region 16c, the source region 17b, the gate insulating layer 22, and the floating gate electrode layer 21c in the upper surface 10a of the silicon substrate 10. A transistor 106d is formed of the source region 17b, the channel region 16d, the drain region 18c, the gate insulating layer 22, and the floating gate electrode layer 21d in the upper surface 10a of the silicon substrate 10. The transistors 106a to 106d (also generally referred to as the "transistor 106") are n-channel MOSFETs (Metal-Oxide-Semiconductor Field-Effect Transistors).

As shown in FIG. 4 and FIG. 9 to FIG. 14, contacts 24a, 24b, and 24c are provided on the first semiconductor region 11; and first interconnects 25a, 25b, and 25c are provided respectively on the contacts 24a, 24b, and 24c. The first interconnect 25a is connected to the drain region 18a of the first semiconductor region 11 via the contact 24a. The first interconnect 25b is connected to the source region 17a of the first semiconductor region 11 via the contact 24b. The first interconnect 25c is connected to the drain region 18b of the first semiconductor region 11 via the contact 24c.

Contacts 24d, 24e, and 24f are provided on the second semiconductor region 12; and first interconnects 25d, 25e, and 25f are provided respectively on the contacts 24d, 24e, and 24f. The first interconnect 25d is connected to the drain region 18c of the second semiconductor region 12 via the contact 24d. The first interconnect 25e is connected to the source region 17b of the second semiconductor region 12 via the contact 24e. The first interconnect 25f is connected to the drain region 18d of the second semiconductor region 12 via the contact 24f.

A contact 24g is provided on the end portion of the floating gate electrode layer 21a separated in the Y-direction from the EG diffusion region 13; and a first interconnect 25g is provided on the contact 24g. The first interconnect 25g is connected to the floating gate electrode layer 21a via the contact 24g. Similarly, a contact 24h is provided on the end portion of the floating gate electrode layer 21b separated in the Y-direction from the EG diffusion region 13; and a first interconnect 25h is provided on the contact 24h. The first interconnect 25h is connected to the floating gate electrode layer 21b via the contact 24h. A contact 24i is provided on the end portion of the floating gate electrode layer 21c separated in the Y-direction from the EG diffusion region 13; and a first interconnect 25i is provided on the contact 24i. The first interconnect 25i is connected to the floating gate electrode layer 21a via the contact 24i. A contact 24j is provided on the end portion of the floating gate electrode layer 21d separated in the Y-direction from the EG diffusion region 13; and a first interconnect 25j is provided on the contact 24j. The first interconnect 25j is connected to the floating gate electrode layer 21d via the contact 24j.

A contact 24k is provided on the EG diffusion region 13; and a first interconnect 25k is provided on the contact 24k. The first interconnect 25k is connected to the EG diffusion region 13 via the contact 24k. The first interconnect 25k has a rectangular configuration having the longitudinal direction in the X-direction. For example, the first interconnects 25a to 25k are made of a metal and have substantially the same position in the Z-direction.

As shown in FIG. 5 and FIG. 9 to FIG. 14, a first via 26a is provided on the first interconnect 25a; and a second interconnect 27a is provided on the first via 26a. The second interconnect 27a is connected to the first interconnect 25a by the first via 26a. A first via 26b is provided on the first interconnect 25b; and a second interconnect 27b is provided on the first via 26b. The second interconnect 27b is connected to the first interconnect 25b by the first via 26b. The second interconnect 27b is the source line SL. The source line SL (the second interconnect 27b) extends in the Y-direction and is used commonly by the multiple memory units 103 arranged along the Y-direction.

A first via 26c is provided on the first interconnect 25c; and a second interconnect 27c is provided on the first via 26c. The second interconnect 27c is connected to the first interconnect 25c by the first via 26c. A first via 26d is provided on the first interconnect 25d; and a second interconnect 27d is provided on the first via 26d. The second interconnect 27d is connected to the first interconnect 25d by the first via 26d.

A first via 26e is provided on the first interconnect 25e; and the second interconnect 27b is disposed on the first via 26e. The second interconnect 27b is connected to the first interconnect 25e by the first via 26e. As described above, the second interconnect 27b is the source line SL. Accordingly, the source line SL (the second interconnect 27b) is connected to the source region 17a of the first semiconductor region 11 by the first via 26b, the first interconnect 25b, and the contact 24b and is connected to the source region 17b of the second semiconductor region 12 by the first via 26e, the first interconnect 25e, and the contact 24e.

A first via 26f is provided on the first interconnect 25f; and a second interconnect 27f is provided on the first via 26f. The second interconnect 27f is connected to the first interconnect 25f by the first via 26f. A first via 26g is provided on the first interconnect 25g; and a second interconnect 27g is provided on the first via 26g. The second interconnect 27g is connected to the first interconnect 25g by the first via 26g. A first via 26h is provided on the first interconnect 25h; and a second interconnect 27h is provided on the first via 26h. The second interconnect 27h is connected to the first interconnect 25h by the first via 26h. A first via 26i is provided on the first interconnect 25i; and a second interconnect 27i is provided on the first via 26i. The second interconnect 27i is connected to the first interconnect 25i by the first via 26i. A first via 26j is provided on the first interconnect 25j; and a second interconnect 27j is provided on the first via 26j. The second interconnect 27j is connected to the first interconnect 25j by the first via 26j.

A first via 26k is provided on the first interconnect 25k; and a second interconnect 27k is provided on the first via 26k. The second interconnect 27k is connected to the first interconnect 25k by the first via 26k. However, the first via 26k and the second interconnect 27k are disposed at a position shifted in the X-direction from the region directly above the contact 24k.

As shown in FIG. 6 and FIG. 9 to FIG. 14, a second via 28a is provided on the second interconnect 27a; and a third interconnect 29a is provided on the second via 28a. The third interconnect 29a is connected to the second interconnect 27a by the second via 28a. The third interconnect 29a is the first bit line BL1. The first bit line BL1 (the third interconnect 29a) extends in the X-direction and is used commonly by the multiple memory units 103 arranged along the X-direction.

A second via 28c is provided on the second interconnect 27c; and the third interconnect 29a (the first bit line BL1) is disposed on the second via 28c. The third interconnect 29a is connected to the second interconnect 27c by the second via 28c. Accordingly, the first bit line BL1 (the third interconnect 29a) is connected to the drain region 18a of the first semiconductor region 11 by the second via 28a, the second interconnect 27a, the first via 26a, the first interconnect 25a, and the contact 24a and is connected to the drain region 18c of the first semiconductor region 11 by the second via 28c, the second interconnect 27c, the first via 26c, the first interconnect 25c, and the contact 24c.

A second via 28d is provided on the second interconnect 27d; and a third interconnect 29b is provided on the second via 28d. The third interconnect 29b is connected to the second interconnect 27d by the second via 28d. The third interconnect 29b is the second bit line BL2. The second bit line BL2 (the third interconnect 29b) extends in the X-direction and is used commonly by the multiple memory units 103 arranged along the X-direction.

A second via 28f is provided on the second interconnect 27f; and the third interconnect 29b (the second bit line BL2) is disposed on the second via 28f. The third interconnect 29b is connected to the second interconnect 27f by the second via 28f. Accordingly, the second bit line BL2 (the third interconnect 29b) is connected to the drain region 18c of the second semiconductor region 12 by the second via 28d, the second interconnect 27d, the first via 26d, the first interconnect 25d, and the contact 24d and is connected to the drain region 18d of the second semiconductor region 12 by the second via 28f, the second interconnect 27f, the first via 26f, the first interconnect 25f, and the contact 24f.

A second via 28g is provided on the second interconnect 27g; and a third interconnect 29g is provided on the second via 28g. The third interconnect 29g is connected to the second interconnect 27g by the second via 28g. A second via 28h is provided on the second interconnect 27h; and a third interconnect 29h is provided on the second via 28h. The third interconnect 29h is connected to the second interconnect 27h by the second via 28h. A second via 28i is provided on the second interconnect 27i; and a third interconnect 29i is provided on the second via 28i. The third interconnect 29i is connected to the second interconnect 27i by the second via 28i. A second via 28j is provided on the second interconnect 27j; and a third interconnect 29j is provided on the second via 28j. The third interconnect 29j is connected to the second interconnect 27j by the second via 28j. A second via 28k is provided on the second interconnect 27k; and a third interconnect 29k is provided on the second via 28k. The third interconnect 29k is connected to the second interconnect 27k by the second via 28k.

As shown in FIG. 7 and FIG. 9 to FIG. 14, a third via 30g is provided on the third interconnect 29g; and a fourth interconnect 31g is provided on the third via 30g. The fourth interconnect 31g is connected to the third interconnect 29g by the third via 30g. Similarly, a third via 30h is provided on the third interconnect 29h; and a fourth interconnect 31h is provided on the third via 30h. The fourth interconnect 31h is connected to the third interconnect 29h by the third via 30h. A third via 30i is provided on the third interconnect 29i; and a fourth interconnect 31i is provided on the third via 30i, The fourth interconnect 31i is connected to the third interconnect 29i by the third via 30i. A third via 30j is provided on the third interconnect 29j; and a fourth interconnect 31j is provided on the third via 30j. The fourth interconnect 31j is connected to the third interconnect 29j by the third via 30j.

A third via 30k is provided on the third interconnect 29k; and a fourth interconnect 31k is provided on the third via 30k. The fourth interconnect 31k is connected to the third interconnect 29k by the third via 30k. The fourth interconnect 31k is the erase gate line EG. The erase gate line EG (the fourth interconnect 31k) extends in the Y-direction and is used commonly by the multiple memory units 103 arranged along the Y-direction.

As shown in FIG. 8 and FIG. 9 to FIG. 14, a fourth via 32g is provided on the fourth interconnect 31g; and a lower electrode layer 33a is provided on the fourth via 32g. The lower electrode layer 33a is connected to the fourth interconnect 31g by the fourth via 32g. Accordingly, the lower electrode layer 33a is connected to the floating gate electrode layer 21a via the fourth interconnect 31g, the third interconnect 29g, the second interconnect 27g, and the first interconnect 25g.

A fourth via 32h is provided on the fourth interconnect 31h; and a lower electrode layer 33b is provided on the fourth via 32h. The lower electrode layer 33b is connected to the fourth interconnect 31h by the fourth via 32h. Accordingly, the lower electrode layer 33b is connected to the floating gate electrode layer 21b via the fourth interconnect 31h, the third interconnect 29h, the second interconnect 27h, and the first interconnect 25h.

A fourth via 32i is provided on the fourth interconnect 31i; and a lower electrode layer 33c is provided on the fourth via 32i. The lower electrode layer 33c is connected to the fourth interconnect 31i by the fourth via 32i. Accordingly, the lower electrode layer 33c is connected to the floating gate electrode layer 21c via the fourth interconnect 31i, the third interconnect 29i, the second interconnect 27i, and the first interconnect 25i.

A fourth via 32j is provided on the fourth interconnect 31j; and a lower electrode layer 33d is provided on the fourth via 32j. The lower electrode layer 33d is connected to the fourth interconnect 31j by the fourth via 32j. Accordingly, the lower electrode layer 33d is connected to the floating gate electrode layer 21d via the fourth interconnect 31j, the third interconnect 29j, the second interconnect 27j, and the first interconnect 25j.

When viewed from above, the configurations of the lower electrode layers 33a to 33d each are rectangles having longitudinal directions in, for example, the Y-direction. When viewed from above, each of the lower electrode layers 33a to 33d occupies about ¼ of the region corresponding to the memory unit 103. The lower electrode layer 33a and the lower electrode layer 33b are arranged in the X-direction; the lower electrode layer 33c and the lower electrode layer 33d are arranged in the X-direction; the lower electrode layer 33a and the lower electrode layer 33c are arranged in the Y-direction; and the lower electrode layer 33b and the lower electrode layer 33d are arranged in the Y-direction. The lower electrode layers 33a to 33d are separated from each other.

Capacitance insulating layers 34a to 34d are provided respectively on the lower electrode layers 33a to 33d. An upper electrode layer 35a is provided in a region including a region on the capacitance insulating layer 34a and a region on the capacitance insulating layer 34c. The upper electrode layer 35a is the first gate line CG1. The capacitance insulating layers 34a to 34d may be portions of a continuous insulating film.

An upper electrode layer 35b is provided in a region including a region on the capacitance insulating layer 34b and a region on the capacitance insulating layer 34d. The upper electrode layer 35b is the second gate line CG2. The first gate line CG1 (the upper electrode layer 35a) and the second gate line CG2 (the upper electrode layer 35b) extend in the Y-direction and are used commonly by the multiple memory units 103 arranged along the Y-direction.

The MIM capacitor 108a is formed of the lower electrode layer 33a, the capacitance insulating layer 34a, and the upper electrode layer 35a. A MIM capacitor 108b is formed of the lower electrode layer 33b, the capacitance insulating layer 34b, and the upper electrode layer 35b. A MIM capacitor 108c is formed of the lower electrode layer 33c, the capacitance insulating layer 34c, and the upper electrode layer 35a. A MIM capacitor 108d is formed of the lower electrode layer 33d, the capacitance insulating layer 34d, and the upper electrode layer 35b. The MIM capacitors 108a to 108d also are generally referred to as the "MIM capacitor 108."

Operations of the semiconductor device according to the embodiment will now be described.

FIG. 15 is a table showing the potential applied to the interconnects in the operations of the semiconductor device according to the embodiment.

Program Operation

As shown in FIG. 2 and FIG. 15, when programming data to the memory element 104, the first bit line BL1 (the third interconnect 29a) and the source line SL (the second interconnect 27b) are set to the floating state; subsequently, a high potential HV is applied to the first gate line CG1 (the upper electrode layer 35a); and a ground potential GND is applied to the erase gate line EG (the fourth interconnect 31k). The high potential HV is, for example, 10 V.

Thereby, the potential of the floating gate electrode FL (the floating gate electrode layer 21a) is increased near the high potential HV by the coupling effect of the MIM capacitor 108a; and a voltage is applied to the capacitor 107. As a result, a tunnel current flows through the gate insulating layer 22 between the corner portion 13a of the EG diffusion region 13 and the corner portion 23a of the floating gate electrode layer 21a; and electrons are injected into the floating gate electrode layer 21a. Thereby, the data is programmed to the transistor 106a.

Read Operation

When reading the data programmed to the memory element 104, a bit line potential VBL is applied to the first bit line BL1; and the ground potential GND is applied to the source line SL. In this state, a read potential Vread is applied to the first gate line CG1; and the ground potential GND is applied to the erase gate line EG. The bit line potential VBL and the read potential Vread are, for example, potentials between the ground potential GND and the high potential HV and are, for example, several V. At this time, whether or not a current flows between the source-drain of the transistor 106a is dependent on the charge amount stored in the floating gate electrode FL (the floating gate electrode layer 21a). Thus, the data that is programmed to the transistor 106a can be read.

Erase Operation

When erasing the data programmed to the memory element 104, the first bit line BL1 and the source line SL are set to the floating state; subsequently, the ground potential GND is applied to the first gate line CG1; and the high potential HV is applied to the erase gate line EG.

Thereby, the potential of the floating gate electrode FL is reduced near the ground potential GND by the coupling effect of the MIM capacitor 108a; and a voltage is applied to the capacitor 107. As a result, a tunnel current flows through the gate insulating layer 22 between the corner portion 13a of the EG diffusion region 13 and the corner portion 23a of the floating gate electrode layer 21a; and electrons are discharged from the floating gate electrode layer 21a. The data that is programmed to the transistor 106a is erased thereby.

Operations of the embodiment will now be described.

In the embodiment, the MIM capacitor 108 is disposed above the transistor 106 and the capacitor 107. The surface area of the memory unit 103 can be reduced thereby.

In the embodiment, the capacitor 107 is formed between one common EG diffusion region 13 and the floating gate electrode layers 21 of four transistors 106. Thereby, it is sufficient to provide one EG diffusion region 13 for four memory elements 104; therefore, the surface area of the memory unit 103 can be reduced further.

In the embodiment, when viewed from above, the configuration of the EG diffusion region 13 is set to be a rectangle; and the four corner portions 13a to 13d of the EG diffusion region 13 respectively overlap the corner portions 23a to 23d of the four floating gate electrode layers 21a to 21g. Thereby, higher uniformity of the overlapping surface areas between the EG diffusion region 13 and the floating gate electrode layers 21 is easy; and higher uniformity of the operations of the memory element 104 can be realized.

According to the embodiments described above, a semiconductor device can be realized in which downsizing is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate;
a first semiconductor region formed in an upper layer portion of the semiconductor substrate;
a diffusion region formed in the upper layer portion of the semiconductor substrate and electrically isolated from the first semiconductor region;
a first bit line connected to a first portion of the first semiconductor region;
a source line connected to a second portion of the first semiconductor region;
an erase gate line connected to the diffusion region;
a gate insulating layer provided on the diffusion region and on a third portion of the first semiconductor region, the third portion being between the first portion and the second portion of the first semiconductor region;
a first gate electrode layer provided on the gate insulating layer;
a first lower electrode layer provided on the first gate electrode layer and connected to the first gate electrode layer;
a capacitance insulating layer provided on the first lower electrode layer; and
a first upper electrode layer capacitively coupled to the first lower electrode layer with the capacitance insulating layer interposed, a portion of the first gate electrode layer overlapping a first portion of the diffusion region in a vertical direction.

2. The device according to claim 1, wherein a tunnel current is able to flow between the diffusion region and the first gate electrode layer via the gate insulating layer.

3. The device according to claim 1, further comprising:
a second semiconductor region formed in the upper layer portion of the semiconductor substrate and electrically isolated from the first semiconductor region and the diffusion region;
a second bit line connected to a first portion and a second portion of the second semiconductor region;
a second gate electrode layer;
a third gate electrode layer;
a fourth gate electrode layer;
a second lower electrode layer provided on the second gate electrode layer and connected to the second gate electrode layer;
a third lower electrode layer provided on the third gate electrode layer and connected to the third gate electrode layer; and
a fourth lower electrode layer provided on the fourth gate electrode layer and connected to ttle fourth gate electrode layer,
the first bit line being connected also to a fourth portion of the first semiconductor region,
the source line being connected also to a third portion of the second semiconductor region, the third portion being between the first portion and ttle second portion of the second semiconductor region;
a portion of the gate insulating layer being disposed between the first gate electrode layer and the first portion of the diffusion region,
the second gate electrode layer being disposed in a region directly above a fifth portion of the first semiconductor region, and being disposed on the gate insulating layer in a region directly above a second portion of the diffusion region, the fifth portion of the first semiconductor region being between the second portion and the fourth portion of the first semiconductor region,
the third gate electrode layer being disposed in a region directly above a fourth portion of the second semiconductor region, and being disposed on the gate insulating layer in a region directly above a third portion of the diffusion region, the fourth portion of the second semiconductor region being between the first portion and the third portion of the second semiconductor region,
the fourth gate electrode layer being disposed in a region directly above a fifth portion of the second semiconductor region, and being disposed on the gate insulating layer in a region directly above a fourth portion of the diffusion region, the fifth portion of the second semiconductor region being between the second portion and the third portion of the second semiconductor region,
tunnel currents being able to flow via the gate insulating layer between the diffusion region and the second gate electrode layer, between the diffusion region and the third gate electrode layer, and between the diffusion region and the fourth gate electrode layer.

4. The device according to claim 3, wherein
a configuration of the diffusion region is a rectangle when viewed from above, and
the first portion, the second portion, the third portion, and the fourth portion of the diffusion region are corner portions of the rectangle.

5. The device according to claim 3, further comprising a second upper electrode layer capacitively coupled to the second lower electrode layer and to the fourth lower electrode layer, the first upper electrode layer being capacitively coupled also to the third lower electrode layer.

6. The device according to claim 3, wherein
the first bit line and the second bit line extend in a first direction parallel to an upper surface of the semiconductor substrate, and
the source line and the erase gate line extend in a second direction, the second direction being parallel to the upper surface of the semiconductor substrate and crossing the first direction.

7. The device according to claim 6, wherein
the first gate electrode layer and the second gate electrode layer are arranged in the first direction, and
the first gate electrode layer and the third gate electrode layer are arranged in the second direction.

* * * * *